United States Patent [19]
Phillips

[11] 3,989,931
[45] Nov. 2, 1976

[54] PULSE COUNT GENERATOR FOR WIDE RANGE DIGITAL PHASE DETECTOR

[75] Inventor: Donald E. Phillips, Cedar Rapids, Iowa

[73] Assignee: Rockwell International Corporation, El Segundo, Calif.

[22] Filed: May 19, 1975

[21] Appl. No.: 578,773

[52] U.S. Cl. ................ 235/92 FQ; 235/92 PS; 235/92 PB; 235/92 EV; 235/92 FP; 235/92 R; 328/134; 324/83 D

[51] Int. Cl.² ............... G06M 3/12; G06M 3/14; H03K 9/00

[58] Field of Search ....... 235/92 FQ, 92 PB, 92 EV, 235/92 FP, 92 PS; 328/134; 324/83 D

[56] References Cited
UNITED STATES PATENTS

| | | |
|---|---|---|
| 3,124,755 | 3/1964 | Williamson et al. ............. 328/134 |
| 3,176,208 | 3/1965 | Gifft ............................. 235/92 PS |
| 3,714,463 | 1/1973 | Laune ............................ 328/134 |
| 3,866,133 | 2/1975 | DeBloois et al. ................ 328/134 |

*Primary Examiner*—Joseph M. Thesz
*Attorney, Agent, or Firm*—Howard R. Greenberg; Robert J. Crawford

[57] ABSTRACT

A wide range digital phase detector employs a pulse count generator which provides mutually exclusive counting pulses corresponding to the pulses in the two pulse trains to be compared, thereby ensuring that all pulses including those which are coincident are properly registered and accounted for.

14 Claims, 2 Drawing Figures

PULSE COUNT GENERATOR FOR WIDE RANGE DIGITAL PHASE DETECTOR

BACKGROUND OF THE INVENTION

The present invention pertains generally to digital phase detectors and specifically to a pulse count generator for use therein to permit the phase detection function to be accomplished through a counting process which ensures that all pulses in the two signal pulse trains to be compared, including coincident pulses, are properly counted.

As is well known, digital phase detectors are often used in phase lock loop circuits to provide the correction signal for maintaining correspondence of frequency between the tracking and reference signals. Maintenance of frequency correspondence in the presence of frequency variations in the tracking signal is greatly enhanced when the phase difference between the tracking and reference signals remains within the phase lock range of the phase detector, viz. the scope of operation within which the integrated output of the phase detector remains a linear function of the phase difference. Most, if not all, digital phase detectors afford a phase lock range of only 360° which permits the tracking signal to slip or advance by only one cycle before the detector linear range is exceeded. By extending the detector linear range, its usefulness and versatility can be materially improved by increasing the speed with which phase lock is achieved and eliminating or at least reducing the number of excursions out of phase lock which degrade performance and create frequency overshoots which can detrimentally affect other nearby equipment.

One of the problems in attempting to extend the phase lock range in a phase detector relates to the need for accounting for all pulses in the tracking and reference signals to achieve reliable operation. All pulses must be properly processed irrespective of their time of occurrence. Thus, coincident pulses in the tracking and reference signals which occur as the tracking signal shifts with respect to the reference signal must be registered and accounted for to avoid introducing errors into the phase lock loop operation. Since commercial up/down digital counters cannot count both ways at the same time and the use of two separate counters for overcoming the coincident pulse problem would only materially add to the cost of a digital phase detector in an already highly competitive market, there may not have been sufficient financial incentive to justify attempts at extending the phase lock range of digital phase detectors.

With the foregoing in mind, it is a primary object of the present invention to provide a pulse count generator for supplying mutually exclusive counting pulses corresponding to the pulses in two separate pulse trains.

It is a further object of the present invention to provide such a pulse count generator having a simple and inexpensive design so that it may be easily and economically used in a digital phase detector for extending its phase lock range to enhance phase lock loop operation.

These, as well as other objects, and the means by which they are achieved may be best appreciated by referring to the Detailed Description of the Invention which follows hereinafter together with the appended drawings.

BRIEF DESCRIPTION OF THE INVENTION

The pulse count generator for providing mutually exclusive counting pulses corresponding to the pulses contained in two pulse trains comprises two storage means, each being associated with one of the pulse trains for providing an actuating signal each time a pulse is detected in its respective pulse train. These actuating signals are applied to a pulse generator means having two individual inputs for connection to the respective outputs of the storage means and two outputs, each one being associated with a different one of its inputs. Each generator means output provides a bilevel signal, the first level occurring in the absence of an actuating signal at its associated input and the second level occurring in the presence of an actuating signal, arranged so that an output is enabled to change to a second level signal only in the presence of a first level signal at the other output. Each storage means is connected to the output of the pulse generator means associated with the generator means input to which it is connected for terminating each actuating signal in response to the second level signal generated therefrom.

The pulse count generator is incorporated into a digital phase detector by connecting the two outputs of the generator means to an up/down digital counter whose output is connected to a digital/analog converter to provide an analog signal which is a linear function of the phase difference between the two pulse trains respectively applied to the two storage means. It will be readily seen that the phase lock range of the phase detector, in which the detector output remains a linear function of phase difference, can be easily increased in increments of 360° merely by increasing the count capability of the up/down digital counter by one.

In the preferred embodiment, the pulse count generator of the invention is simply and easily implemented through the use of a D-type flip-flop for each storage means and two cross-coupled NAND gates for the pulse generator means. To impart versatility to the pulse count generator so as to render it compatible with commercial digital counters having different characteristics, means are included for controlling the duration of counting pulses (second level signals) provided at the output of the pulse generator means to permit the counter sufficient time to register each counting pulse and means are also provided to ensure some minimum time period in between counting pulses to accommodate the time required by the counter to prepare for a consecutive pulse.

DETAILED DESCRIPTION OF THE INVENTION

Figure 1:
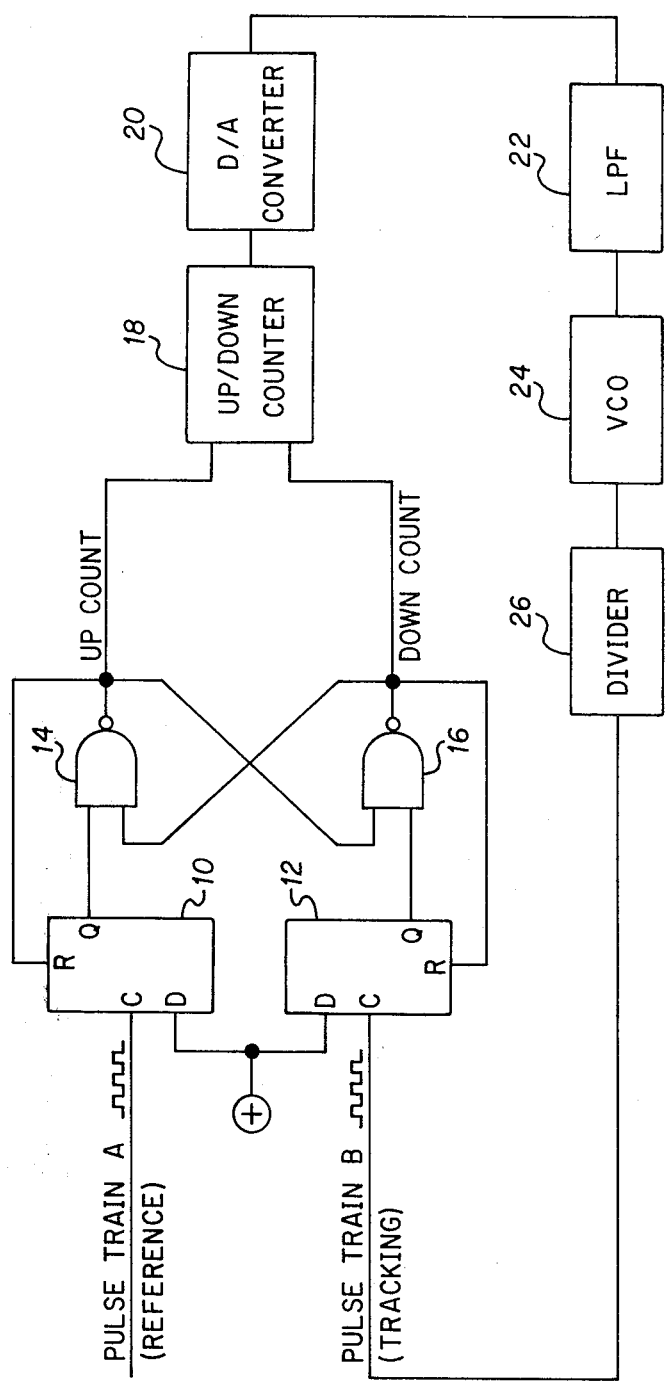
FIG. 1 depicts the preferred embodiment of the pulse count generator already incorporated into a wide range phase detector for use in a phase lock-loop circuit.

As shown in FIG. 1, the pulse count generator of the invention comprises two D-type flip-flops 10 and 12, whose clock (C) inputs are respectively connected to receive two pulse trains A and B. When employed in a phase detector as depicted, pulse train A constitutes a reference signal and pulse train B a tracking signal whose frequency attempts to follow that of pulse train A by virtue of the phase lock loop operation. As is well known, each time a pulse is applied to the C input of a D-type flip-flop, such as 10 or 12, the signal level appearing at its D input at that time is reflected at its Q output (with either the leading or trailing edge of the pulse providing the activating signal). The Q outputs of flip-flops 10 and 12 are connected respectively as inputs to NAND gates 14 and 16 whose outputs are cross-coupled as second inputs to one another. The output of each NAND gate 14 and 16 is also connected to the reset (R) input of the flip-flop 10 or 12 which is connected to its associated input.

In the absence of any pulse at its C input, each flip-flop 10 and 12, reposes in the reset state with its Q output exhibiting a low level logic signal. This low level signal causes the output of the associated NAND gate 14 or 16 to which it is applied to exhibit a corresponding high level signal. Thus, in the absence of any pulses in either pulse train A or B, both NAND gate outputs are high. Assuming now that a pulse in train A is received on lead C, flip-flop 10 is triggered into the set state whereby the high level signal (designated positive) continuously applied to its D input is reflected at its Q output. The high Q output of flip-flop 10 combines with the high cross-coupled output of NAND gate 16 to cause the output of NAND gate 14 to change from a high level signal to a low level signal. This low level signal when applied to the R input of flip-flop 10 causes it to return to the reset state, whereupon the low Q output thereof causes the output signal of NAND gate 14 to return to a high level. Each time a pulse appears in pulse train A, this sequence is repeated so that the transition to and from a low level signal at the output of NAND gate 14 constitutes a counting pulse which may be used as an indication of the presence of a pulse in pulse train A. Likewise for NAND gate 16 with respect to pulse train B since its operation in conjunction with flip-flop 12 is exactly the same as just described.

All pulses in pulse trains A and B, are reflected at the outputs of NAND gates 14 and 16 by corresponding counting pulses irrespective of their coincidence. For example, suppose coincident with or immediately subsequent to a pulse in train A which sets flip-flop 10, a pulse appears in train B thereby setting flip-flop 12. The low level signal appearing at the output of NAND gate 14 indicating the presence of an A pulse partially disables NAND gate 16 so that its output signal cannot likewise assume a low level to register the presence of a B pulse. However, as soon as flip-flop 10 is reset by the low level output of NAND gate 14, the consequent return of the NAND gate 14 output to a high level signal enables the high Q output of flip-flop 12 to be reflected as a low level signal at the output of NAND gate 16 thereby registering the B pulse. Each flip-flop 10 and 12 acts as a storage means for storing the occurrence of a pulse in its respective pulse train until properly registered and accounted for at the output of its associated NAND gate 14 and 16 since once set in response to a pulse, the flip-flop cannot be reset until the associated NAND gate output signal assumes a low level thereby registering the pulse. This is so even if the activating pulse in the pulse train terminates prior to its registration at the output of the associated NAND gate.

It will be observed that the arrangement shown, and just described, precludes the possibility of the simultaneous occurrence of low level signals at the outputs of NAND gates 14 and 16 and consequently the simultaneous registration of respective pulses in pulse trains A and B. Even if actuating signals should simultaneously occur at the Q outputs of flip-flops 10 and 12, the cross-coupled arrangement for NAND gates 14 and 16 ensures that the first NAND gate to register a pulse in its associated pulse train by generating a low level signal at its output, inhibits the other NAND gate from doing likewise until its output signal returns to a high level. Thus, when the outputs of NAND gates 14 and 16 are connected as inputs to an up/down binary counter 18 as shown in FIG. 1 (the outputs of NAND gates 14 and 16 being considered equivalent to up and down counts respectively), the mutual exclusivity of the output counting pulses obviates any possibility that the counter might be called on to count both ways simultaneously as commercial counters are not wont to do.

The output of up/down counter 18 (either the leading or trailing edge of the counting pulses at the outputs of NAND gates 14 and 16 may be used to increment and decrement the counter output respectively), which is the digital equivalent of the difference in pulses in pulse trains A and B is converted to an analog equivalent via digital/analog converter 20. The output of converter 20 is then passed through conventional lowpass filter (LPF) 22 to control the operation of the voltage controlled oscillator (VCO) 24. The output of VCO 24 is applied to the C input of flip-flop 12, normally through a divider circuit 26, to complete the connection for the phase lock loop circuit. It will be readily apparent that the output of lowpass filter 22 will always be an analog signal linearly proportional to the phase difference between pulse trains A and B within the counting range of up/down counter 18. Two counts are required for the conventional phase lock range of 360°, one count corresponding to 0° and the other to 360°. Thereafter, each additional count extends the phase lock range by 360° so that the count of 3 provides an overall range of 72°, a count of 4 provides an overall range of 1,080° and a count of N provides (N−1) × 360°. Each 360° extension in range permits the tracking signal (pulse train B) to slip or advance one additional cycle with respect to the reference signal (pulse train A) without loss of phase lock.

Figure 2:
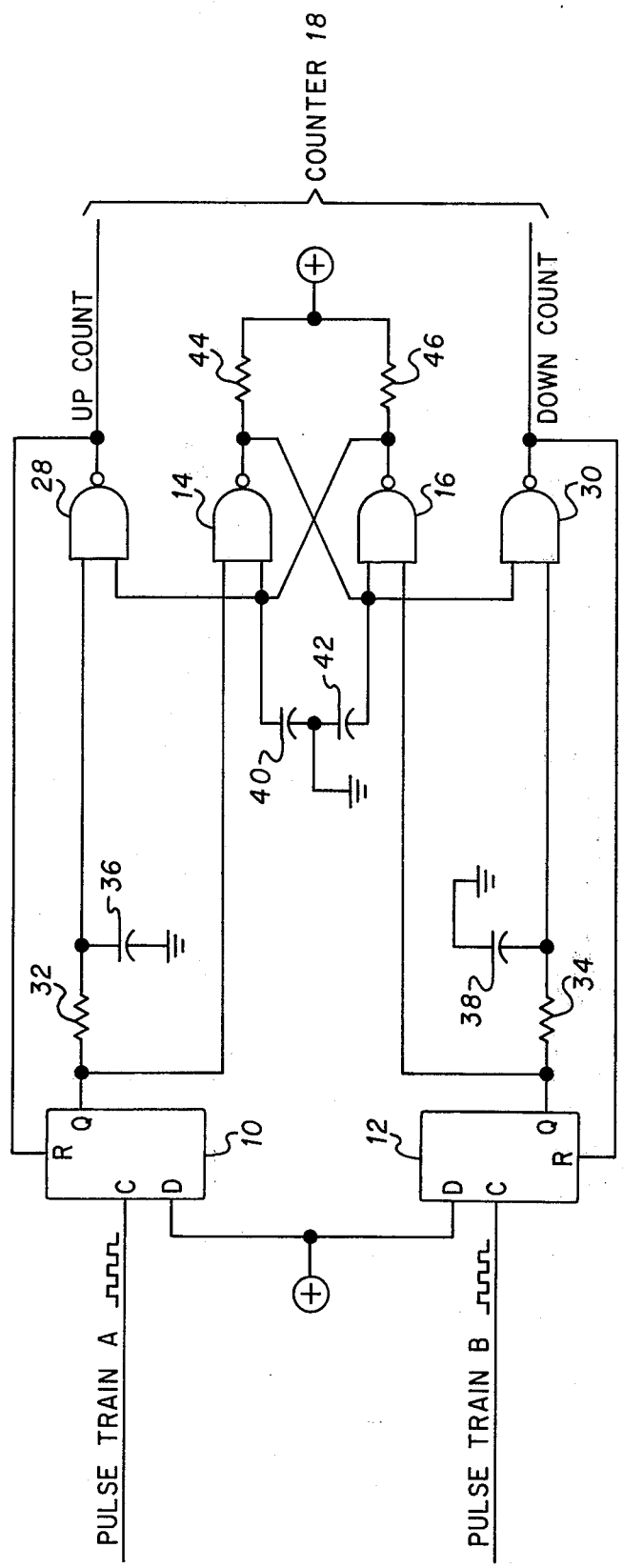
FIG. 2 shows the pulse count generator of FIG. 1 modified so as to afford the additional features for controlling the duration of and spacing between counting pulses.

Since commercial counters require a finite pulse duration for properly registering a count in response to the pulse to be counted as well as a minimum space between pulses to be counted to meet its set up time, the pulse count generator of FIG. 1 is shown modified accordingly in FIG. 2, the same numerical designations being used to identify like elements. In this more sophisticated embodiment for the pulse count generator, the mutually exclusive counting pulses are supplied at the outputs of two NAND gates 28 and 30 respectively associated with cross-coupled NAND gates 14 and 16. The outputs of NAND gates 28 and 30 are respectively connected to the R inputs of flip-flops 10 and 12 in lieu of the respective outputs of NAND gates 14 and 16. Each of the NAND gates, 28 and 30, has an input connected to the respective Q outputs of flip-flops 10 and 12 through respective resistors 32 and 34. These same inputs are respectively connected to ground (it being realized, of course, that all signals alluded to are referenced to ground) through capacitors 36 and 38. A second input of each of the NAND gates 28 and 30 is connected to the second input of its associated cross-coupled NAND gate 14 and 16 respectively (derived from the output of the other cross-coupled NAND gate). Connected between this second input and ground are capacitors 40 and 42 respectively associated with NAND gates 14 and 16. The outputs of NAND gates 14 and 16 are connected to a high level signal source through respective resistors 44 and 46.

Assuming that once again in the absence of pulses in pulse trains A and B the Q outputs of flip-flops 10 and 12 are low and the outputs of all NAND gates are high, the appearance of a pulse in pulse train A, sets flip-flop 10 causing its Q output to assume a high level. Whereas previously in FIG. 1, the up count output of NAND gate 14 changed to a low level signal immediately to register the occurrence of that pulse (the response time being limited only by the internal design of NAND gate 14), the up count counting pulse signal provided at the output of NAND gate 28 cannot begin until capacitor 36 has charged sufficiently as determined by its time constant in conjunction with resistor 32 and the output impedance of flip-flop 10. Similarly, when flip-flop 10 is reset and its Q output returns to a low level at the beginning of the counting pulse, the output of NAND gate 28 cannot change to return to a high level until capacitor 36 is discharged sufficiently via resistor 32 and the input impedance of flip-flop 10. Thus, the charging period for capacitor 36 may be used to set some minimum time between counting pulses at the output of NAND gate 28 corresponding to the counted pulses in pulse train A while the discharge period for capacitor 36 may be used to establish a minimum duration for the counting pulse (presence of low level signal) registered at the output of NAND gate indicative of a pulse in pulse train A. In determining appropriate values for resistor 32 and capacitor 36, the output and input impedances at the Q port of flip-flop 10 would, of course, be included.

As in FIG. 1, cross-coupled NAND gates 14 and 16 afford mutual exclusivity of counting pulses at the outputs of NAND gates 28 and 30 so that an up count cannot coincide with a down count and vice versa. Thus, as soon as the Q output of flip-flop 10 changes to a high level to produce an actuating signal, the two high inputs to NAND gate 14 (both capacitors 40 and 42 are charged at this point) cause its output to assume a low level thereby rapidly discharging capacitor 42. The cross-coupled low level now appearing at the second input of NAND gate 30 inhibits its output from changing from a high level signal to a low level even if a pulse in pulse train B sets flip-flop 12 thereby producing an actuating signal at its Q output. Once flip-flop 10 is thereafter reset at the beginning of the up count pulse, the output of NAND gate 14 returns to a high level thereby permitting capacitor 42 to be charged from the high level signal source via resistor 44. As soon as capacitor 42 charges sufficiently, as determined by its time constant in conjunction with resistor 44, it enables the output of NAND gate 30 to assume a low level in the presence of an actuating signal at the Q output of flip-flop 12. Until this point, however, NAND gate 30 is inhibited, thereby providing some minimum spacing between the registration of an up count and down count. Overlapping counting pulses (low level signals) may be avoided by designing the charging period for capacitor 42 to be greater than the discharge period for capacitor 36 so that the output of NAND gate 28 changes from a low level back to a high following the discharge of capacitor 36 before the output of NAND gate 30 can change from a high level to a low following the charging of capacitor 42. As may be discerned from the symmetry of the logic circuit depicted in FIG. 2, the foregoing discussion is equally applicable to a pulse first appearing in pulse train B followed by a pulse in pulse train A. To ensure that flip-flops 10 and 12 do not miss any pulses in their respective pulse trains, the cyclical period for the pulse trains should be greater than the maximum possible reset time period for the flip-flops which would be equal to the sequential charging periods for capacitors 38 and 40 in the case of flip-flop 10 and pulse train A (A pulse immediately following B pulse) and capacitors 36 and 42 in the case of flip-flop 12 and pulse train B (B pulse immediately following A pulse).

Thus, as delineated by the foregoing Detailed Description, the pulse count generator provides a facile, yet effective, means for supplying mutually exclusive counting pulses corresponding to pulses in dual pulse trains which ensures that all pulses irrespective of coincidence are properly registered and accounted for. The simplicity of the generator renders it eminently suitable for use in a digital phase detector to provide as extensive a phase lock range as desired to enhance phase lock acquisition and minimize frequency overshoots. Since the preferred embodiments described herein can undoubtedly be modified by those skilled in the art without departing from the scope and the spirit of the invention, the foregoing Detailed Description should be considered merely as an exemplification of the invention which will now be claimed hereinbelow.

What is claimed is:

1. A pulse count generator for providing mutually exclusive counting pulses corresponding to the pulses contained in two pulse trains, comprising:

pulse generator means having two inputs and two outputs, each output being associated with a different one of said inputs for providing a bilevel signal, the first level occurring in the absence of an actuating signal at its associated input and the second level occurring in the presence of an actuating signal, arranged so that an output signal is enabled to change to a second level only in the presence of a first level signal at the other output;

first storage means for receiving one of the pulse trains connected to one of said inputs for generating and applying thereto an actuating signal for each pulse contained in that pulse train and also connected to the pulse generator means output associated with said connected input for terminating each actuating signal in response to the second level signal generated therefrom; and second storage means for receiving the other pulse train connected to the other one of said inputs for generating and applying thereto an actuating signal for each pulse contained in that pulse train and also connected to the pulse generator means output associated with said connected other input for terminating each actuating signal in response to the second level signal generated therefrom.

2. The pulse count generator of claim 1 wherein each of said storage means is a D-type flip-flop and said pulse generator means is a pair of cross-coupled NAND gates.

3. The pulse count generator of claim 1 wherein said pulse generator means includes means for predetermining the duration of each second level signal.

4. The pulse count generator of claim 1 wherein said pulse generator means includes means for establishing a minimum time period separating consecutive second level signals.

5. The pulse count generator of claim 3 wherein said pulse generator means includes means for establishing a minimum time period separating consecutive second level signals.

6. The pulse count generator of claim 5 wherein each of said storage means is a D-type flip-flop and said pulse generator means comprises a pair of cross-coupled NAND gates and a pair of NAND gates, each being associated with one of said cross-coupled NAND gates for providing said bilevel signal and having two inputs, one connected in common with the cross-coupled input of its associated cross-coupled NAND gate to said means for establishing a minimum time period separating consecutive second level signals, and the other input connected in common with the second input of its associated cross-coupled NAND gate to the output of its associated storage means, said other input being connected thereto via said means for predetermining the duration of each second level signal.

7. In combination with a digital/analog converter and an up/down digital counter whose output is connected to the converter input, a pulse count generator for providing mutually exclusive counting pulses corresponding to the pulses contained in two pulse trains, comprising:
pulse generator means having two inputs and two outputs, each output being associated with a different one of said inputs for providing a bilevel signal, the first level occurring in the absence of an actuating signal at its associated input and the second level occurring in the presence of an actuating signal, arranged so that an output signal is enabled to change to a second level only in the presence of a first level signal at the other output;
first storage means for receiving one of the pulse trains connected to one of said inputs for generating and applying thereto an actuating signal for each pulse contained in that pulse train and also connected to the pulse generator means output associated with said connected input for terminating each actuating signal in response to the second level signal generated therefrom, and
second storage means for receiving the other pulse train connected to the other one of said inputs for generating and applying thereto an actuating signal for each pulse contained in that pulse train and also connected to the pulse generator means output associated with said connected other input for terminating each actuating signal in response to the second level signal generated therefrom.

8. The pulse count generator of claim 7 wherein said pulse generator means includes means for predetermining the duration of each second level signal.

9. The pulse count generator of claim 7 wherein said pulse generator means includes means for establishing a minimum time period separating consecutive second level signals.

10. The pulse count generator of claim 8 wherein said pulse generator means includes means for establishing a minimum time period separating consecutive second level signals.

11. A wide range phase detector employing a pulse count generator which provides mutually exclusive counting pulses corresponding to the pulses contained in the two pulse trains to be compared, comprising:
pulse generator means having two inputs and two outputs, each output being associated with a different one of said inputs for providing a bilevel signal, the first level occurring in the absence of an actuating signal at its associated input and the second level occurring in the presence of an actuating signal, arranged so that an output signal is enabled to change to a second level only in the presence of a first level signal at the other output;
first storage means for receiving one of the pulse trains connected to one of said inputs for generating and applying thereto an actuating signal for each pulse contained in that pulse train and also connected to the pulse generator means output associated with said connected input for terminating each actuating signal in response to the second level signal generated therefrom;
second storage means for receiving the other pulse train connected to the other one of said inputs for generating and applying thereto an actuating signal for each pulse contained in that pulse train and also connected to the pulse generator means output associated with said connected other input for terminating each actuating signal in response to the second level signal generated therefrom;
an up/down digital counter for receiving the respective outputs of said pulse generator means, and
a digital/analog converter whose input is connected to the output of said digital counter.

12. The detector of claim 11 wherein said pulse generator means includes means for predetermining the duration of each second level signal.

13. The detector of claim 12 wherein said pulse generator means includes means for establishing a minimum time period separating consecutive second level signals.

14. The detector of claim 11 wherein said pulse generator means includes means for establishing a minimum time period separating consecutive second level signals.

* * * * *